(12) United States Patent
Stefanoski

(10) Patent No.: US 7,382,616 B2
(45) Date of Patent: Jun. 3, 2008

(54) COOLING SYSTEM FOR COMPUTER HARDWARE

(75) Inventor: Zoran Stefanoski, San Francisco, CA (US)

(73) Assignee: NVIDIA Corporation, Santa Clara, CA (US)

( * ) Notice: Subject to any disclaimer, the term of this patent is extended or adjusted under 35 U.S.C. 154(b) by 116 days.

(21) Appl. No.: 11/251,342

(22) Filed: Oct. 14, 2005

(65) Prior Publication Data

US 2006/0164808 A1    Jul. 27, 2006

Related U.S. Application Data

(60) Provisional application No. 60/645,997, filed on Jan. 21, 2005.

(51) Int. Cl.
*H05K 7/20* (2006.01)
*H05K 5/00* (2006.01)
*F28D 15/00* (2006.01)

(52) U.S. Cl. ............... 361/698; 361/697; 361/700; 361/703; 361/719; 165/80.3; 165/80.4; 165/104.33; 174/15.2; 174/16.1; 454/184

(58) Field of Classification Search ........ 361/679–711, 361/712–722; 174/15.1–16.3; 165/80.2–80.4, 165/104.21–104.26, 104.33; 454/184
See application file for complete search history.

(56) References Cited

U.S. PATENT DOCUMENTS

| 6,206,087 | B1 * | 3/2001 | Nakase et al. ............. 165/80.3 |
| 6,512,673 | B1 * | 1/2003 | Wiley .......................... 361/695 |
| 6,580,609 | B2 * | 6/2003 | Pautsch ...................... 361/698 |
| 6,625,021 | B1 * | 9/2003 | Lofland et al. ............. 361/697 |
| 6,626,233 | B1 * | 9/2003 | Connors .................... 165/80.3 |
| 6,671,177 | B1 * | 12/2003 | Han .......................... 361/719 |
| 6,685,430 | B2 * | 2/2004 | Chapman ................. 415/208.2 |
| 6,717,811 | B2 * | 4/2004 | Lo et al. .................... 361/698 |

(Continued)

FOREIGN PATENT DOCUMENTS

| CN | 1414628 | 4/2003 |
| WO | WO 2004/055656 | 7/2004 |

OTHER PUBLICATIONS

Translation of Chinese Office Action for Application No. 200610008970.1.

*Primary Examiner*—Jayprakash N. Gandhi
*Assistant Examiner*—Robert J Hoffberg
(74) *Attorney, Agent, or Firm*—Patterson & Sheridan, LLP

(57) ABSTRACT

The present invention represents a significant advancement in the field of cooling systems for computer hardware. In one embodiment, a system for cooling a heat-generating electronic device is provided. The system is mountable to a first side of a circuit board. The system includes a first set of fins, a fan operable to force air through the first set of fins, and a first heat pipe to conduct heat from the heat-generating electronic device to the first set of fins. One advantage of the disclosed cooling system is that it more equally distributes heat across the fins and more equally distributes airflow across surfaces of the fins. Thus, the design increases the effective area of the fin surfaces used in for transferring heat from the heat-generating electronic device to the air, resulting in a more efficient cooling system.

18 Claims, 11 Drawing Sheets

U.S. PATENT DOCUMENTS

| | | | |
|---|---|---|---|
| 6,778,390 B2 * | 8/2004 | Michael | 361/695 |
| 6,795,315 B1 * | 9/2004 | Wu et al. | 361/695 |
| 6,804,115 B2 * | 10/2004 | Lai | 361/695 |
| 6,871,702 B2 * | 3/2005 | Horng et al. | 165/104.33 |
| 6,937,474 B2 * | 8/2005 | Lee | 361/715 |
| 6,966,361 B2 * | 11/2005 | Connors | 165/104.33 |
| 6,982,877 B2 * | 1/2006 | Vinson et al. | 361/719 |
| 7,019,974 B2 * | 3/2006 | Lee et al. | 361/700 |
| 7,128,131 B2 * | 10/2006 | Kubo | 165/80.3 |
| 7,209,356 B2 * | 4/2007 | Lee et al. | 361/719 |
| 2005/0061477 A1 * | 3/2005 | Mira | 165/80.3 |
| 2005/0068727 A1 * | 3/2005 | Yu | 361/689 |
| 2005/0099774 A1 * | 5/2005 | Song | 361/700 |
| 2005/0128710 A1 * | 6/2005 | Beitelmal et al. | 361/709 |
| 2006/0039117 A1 * | 2/2006 | Lee et al. | 361/719 |
| 2007/0047211 A1 * | 3/2007 | Refai-Ahmed et al. | 361/720 |
| 2007/0165374 A1 * | 7/2007 | Chen et al. | 361/687 |

* cited by examiner

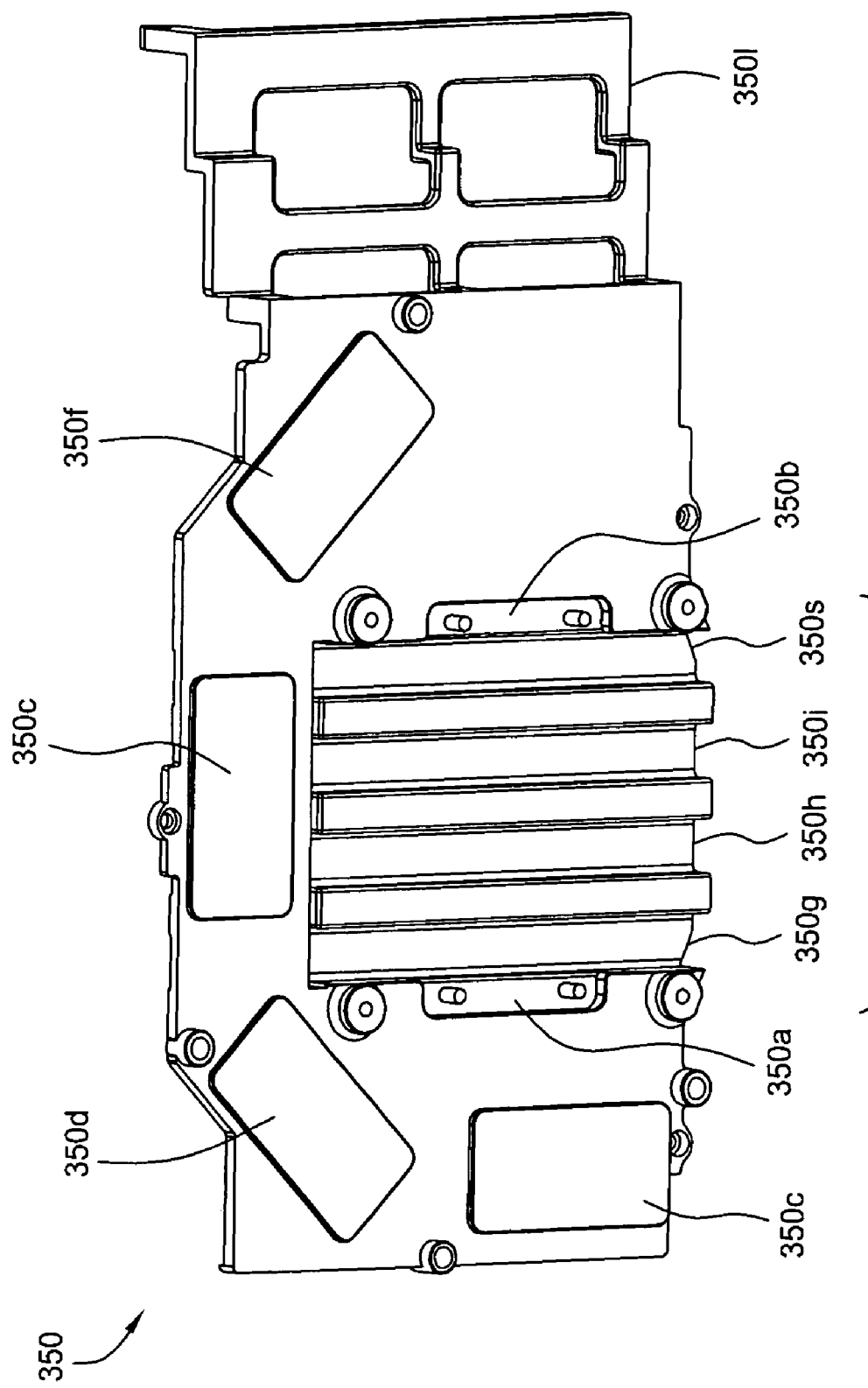

COOLING SYSTEM FOR COMPUTER HARDWARE

CROSS-REFERENCE TO RELATED APPLICATIONS

This application claims the benefit of U.S. Provisional Application No. 60/645,997, filed Jan. 21, 2005, which is hereby incorporated by reference in its entirety.

BACKGROUND OF THE INVENTION

1. Field of the Invention

This invention relates generally to cooling systems for computer hardware and more particularly to a bi-directional thermal solution for computer hardware.

2. Description of the Related Art

FIG. 1 is an isometric view illustrating a prior art cooling system 100 used, for example, to cool heat-generating electronic devices in a computer system, such as a graphics processing unit (GPU). As shown, cooling system 100 characteristically includes a blower/fan 106, fins 109 and a bottom plate 111. Typically, cooling system 100 is thermally coupled to the GPU, for example using thermal adhesive or grease having thermal properties that facilitate transferring heat generated by the GPU to the bottom plate 111. Cooling system 100 may also include a heat sink lid (not shown), which, among other things, prevents particles and other contaminants from entering blower/fan 106 and air blown from blower/fan 106 from escaping cooling system 100. The heat sink lid, together with the fins 109 and the bottom plate 111, define a plurality of air channels 108.

Blower/fan 106 is configured to force air through air channels 108 over bottom plate 111 such that the heat generated by the GPU transfers to the air. The heated air then exits cooling system 100, as depicted by flow lines 114, thereby dissipating the heat generated by the GPU into the external environment. This process cools the GPU, preventing the device from overheating during operation. Persons skilled in the art will understand that air channels 108 typically are configured to direct air blown from blower/fan 106 over bottom plate 111 and into the external environment in a manner that most efficiently removes heat from the GPU.

FIG. 2 is a schematic diagram illustrating a computing device 200, such as a personal computer, server, or mainframe, within which a conventional cooling system 100 for cooling the GPU 216 is incorporated. As shown, computing device 200 includes a housing 201, within which a motherboard 204 resides. Mounted on motherboard 204 are a central processing unit (CPU) 206, a processor cooler 208 for cooling CPU 206, a system fan 210 for removing heat from computing device 200 and one or more peripheral component interface (PCI) cards 212, each interfaced with a slot located in the back part of housing 201. Motherboard 204 further incorporates a graphics card 202 that enables computing device 200 to rapidly process graphics related data for graphics intensive applications such as gaming applications. Graphics card 202 comprises a printed circuit board (PCB) upon which a plurality of circuit components (not shown), such as memory chips and the like, are mounted. In addition, graphics card 200 includes GPU 216, mounted to one face of graphics card 202, for processing graphics related data.

Because the computational requirements of GPU 216 are typically quite substantial, GPU 216 tends to generate a large amount of heat during operation. If the generated heat is not properly dissipated, the performance of GPU 216 degrades. For this reason, cooling system 100, which is configured to remove heat from GPU 216, is coupled to GPU 216.

One drawback to using cooling system 100 is that the blower/fan 106 generates an unequal velocity profile through the fins 109 such that more air passes over the middle portion of each fin 109 as compared to the upper and lower portions of each fin 109. This results in poor heat transfer from the upper and lower portions of each fin to the air leading to a lower overall efficiency of the cooling system 100.

Another drawback is that the size of the dedicated blower/fan within cooling system 100 is such that the blower/fan must be operated at a relatively high speed to generate the necessary airflow over the heat transfer surface area of cooling system 100. High speed operation tends to produce a substantial amount of unwanted acoustic noise, which is annoying to users of computing device 200.

Yet another drawback is that conventional cooling systems employing blowers/fans are proving inadequate to meet the ever increasing heat dissipation requirements resulting from the rapid progression of graphics card capabilities. Further compounding this issue is the fact that while graphics cards are becoming more powerful, the available space for cooling systems remains the same. Thus, substantial improvements in the efficiency of cooling systems are required to maintain pace with the evolution of graphics cards. It is envisioned that extensive modifications or even a redesign of the conventional cooling system may be in order.

Therefore, there exists a need in the art for a more efficient cooling system for high-performance heat-generating electronic devices, such as GPUs.

SUMMARY OF THE INVENTION

In one embodiment, a system for cooling a heat-generating electronic device is provided. The system is mountable to a first side of a circuit board. The system includes a first set of fins, a fan operable to force air through the first set of fins, and a first heat pipe to conduct heat from the heat-generating electronic device to the first set of fins.

One advantage of the disclosed cooling system is that it more equally distributes heat across the fins and more equally distributes airflow across surfaces of the fins. The design increases the effective area of surfaces of the fins used in transferring heat from the heat-generating electronic device to the air, resulting in a more efficient cooling system.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

FIGS. 3A-J are various views of a cooling system, or components thereof, used to cool a heat-generating electronic device, according to one embodiment of the present invention. FIG. 3A is an isometric view of the cooling system. FIGS. 3B and 3C are exploded, isometric views of the cooling system. FIG. 3D is a plan view of the assembled cooling system. FIGS. 3E and 3F are side views of the assembled cooling system. FIG. 3G is a view of a bottom surface of a system base used in the cooling system. FIG. 3H is a view of a heat sink plate used in the cooling system. FIG. 3I is a partial schematic of the fan used in the cooling system. FIG. 3J is a schematic of the cooling system adapted for use with a computing device. A shroud of the cooling system has been omitted from FIGS. 3A and 3D-3F for the sake of illustration.

DETAILED DESCRIPTION OF PREFERRED EMBODIMENT(S)

All references to directions in describing parts, such as top and bottom are for convenience and not meant to limit embodiments of the invention in any way.

Figure 1:
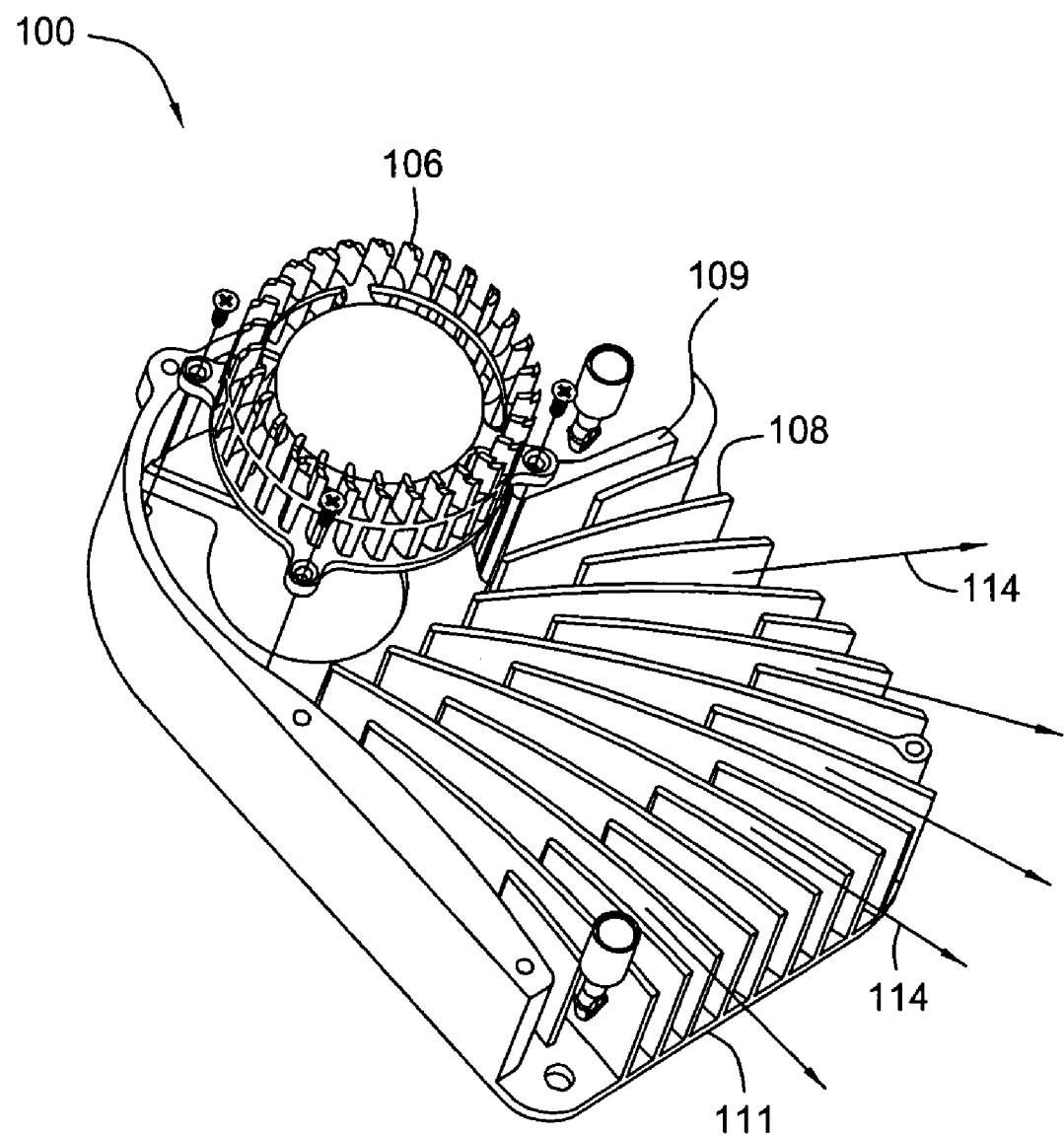
FIG. 1 is an isometric view illustrating a prior art system used to cool a heat-generating electronic device.
Figure 2:
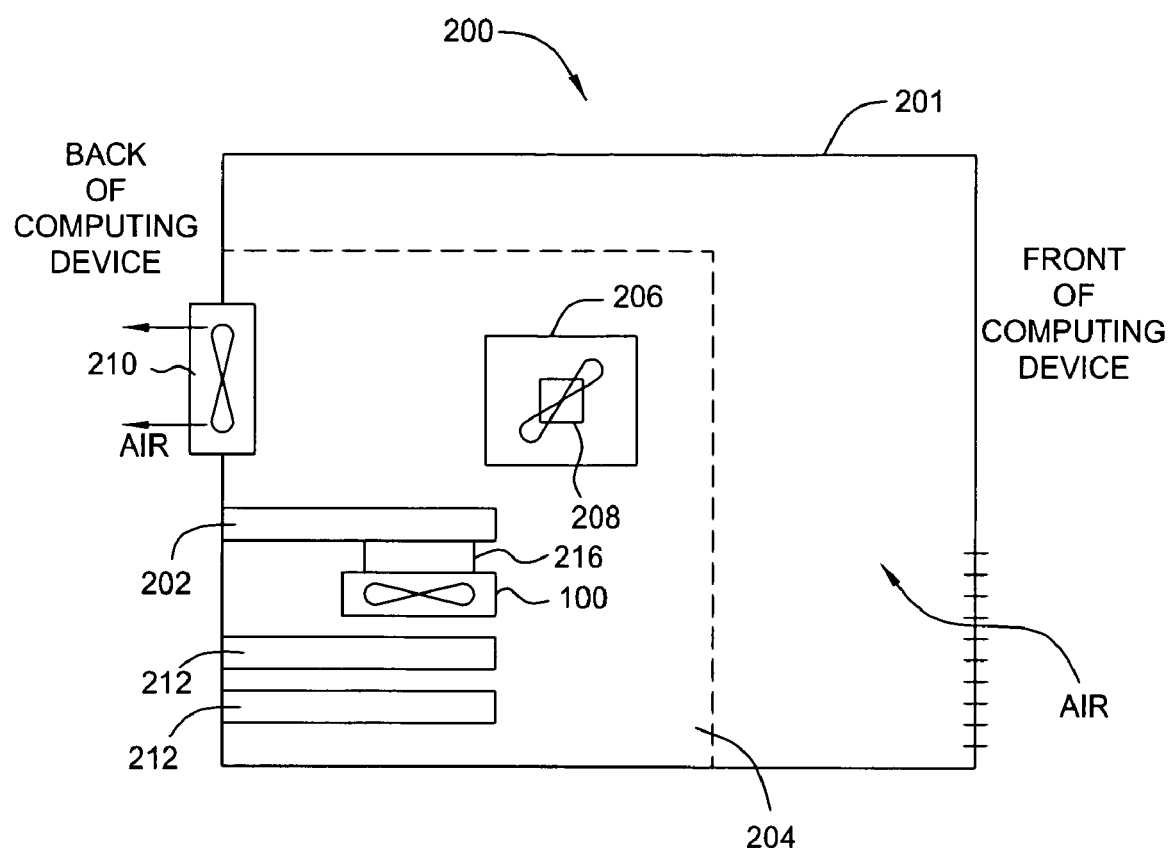
FIG. 2 is a schematic diagram illustrating a prior art computing system adapted for use with the prior art cooling system of FIG. 1.
Figure 3A:
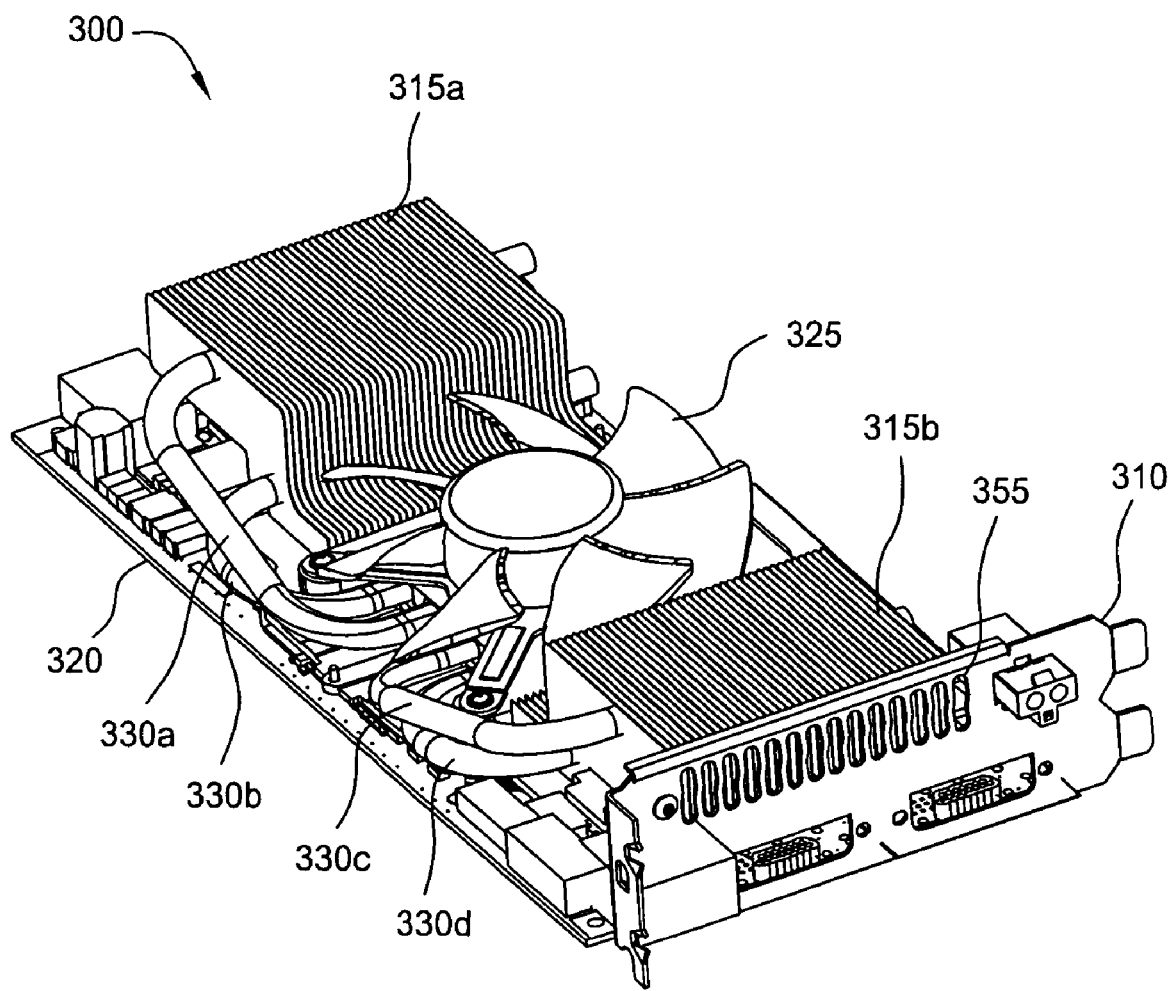
Figure 3B:
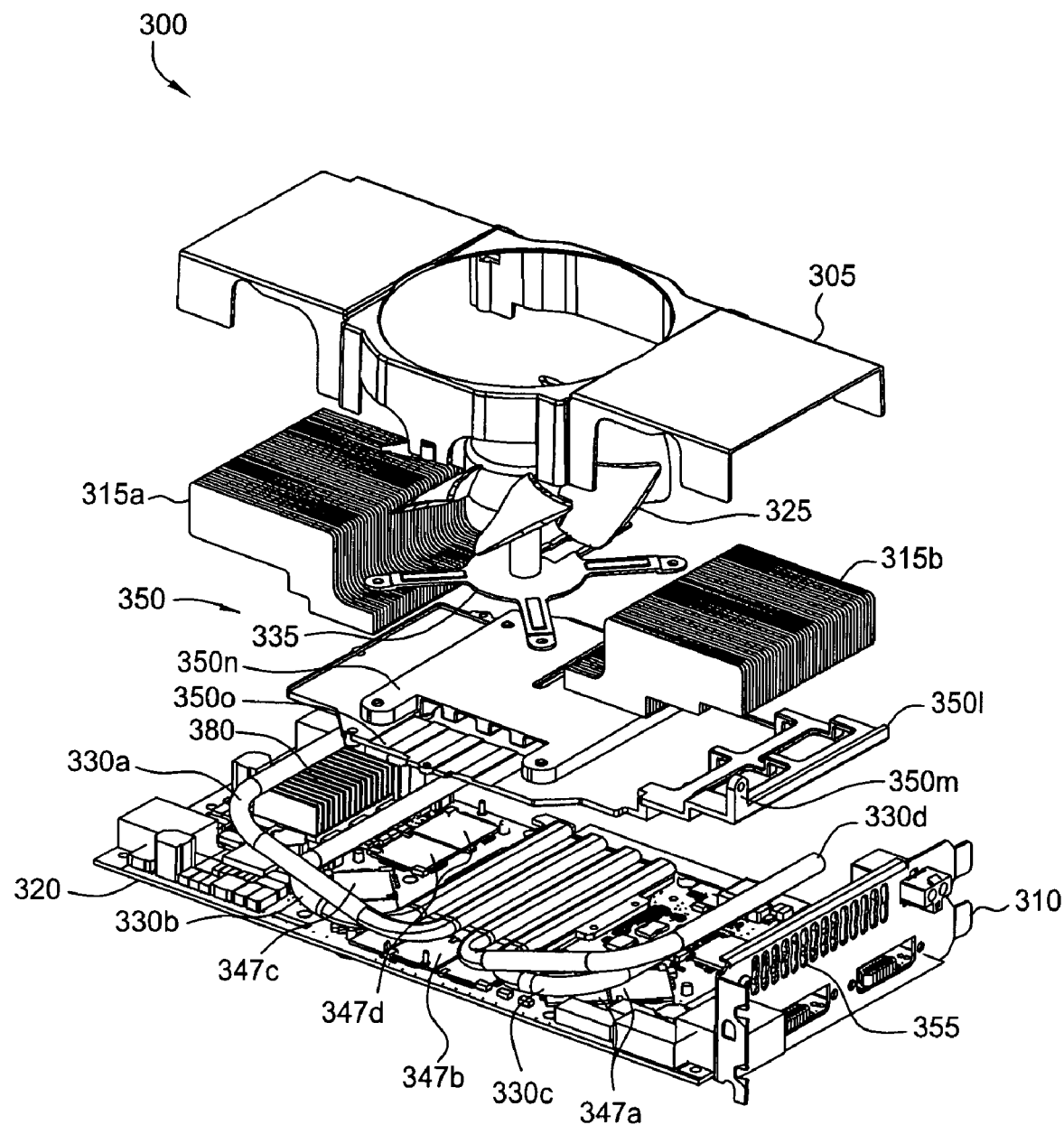
Figure 3C:
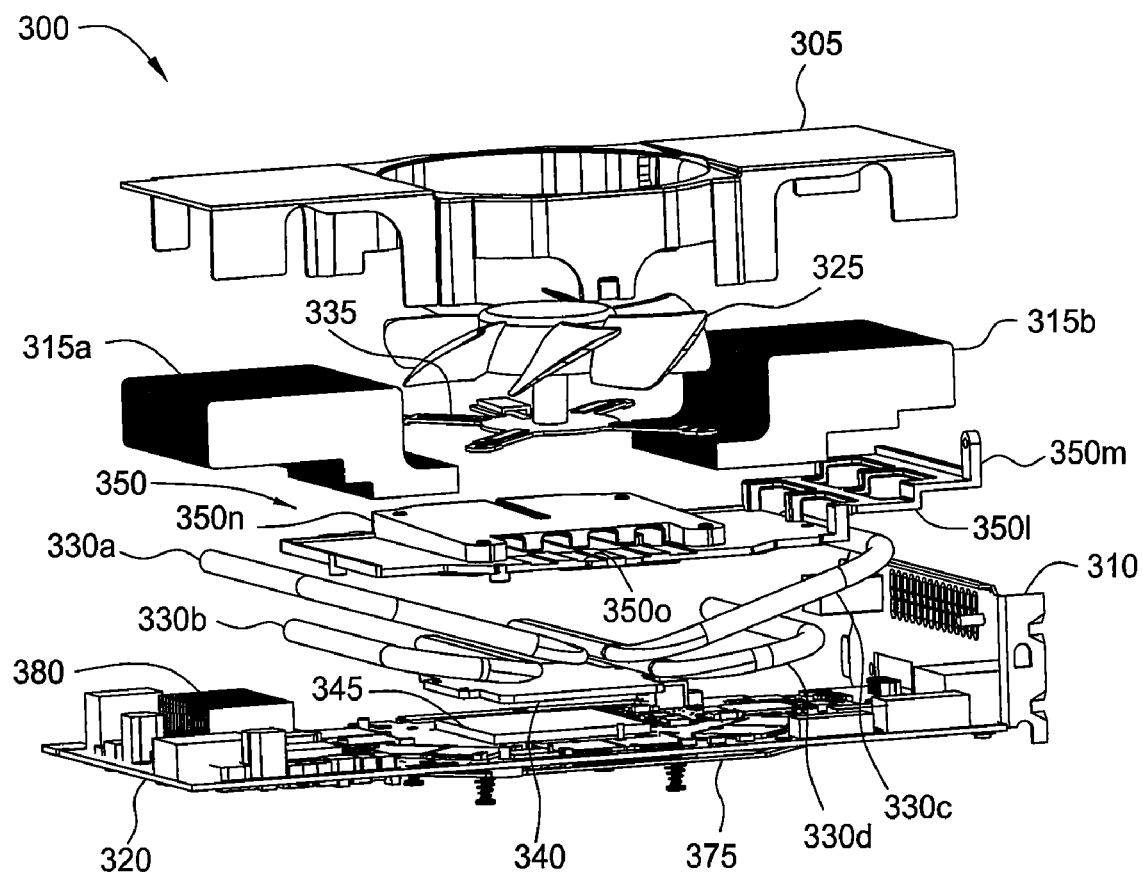
Figure 3D:
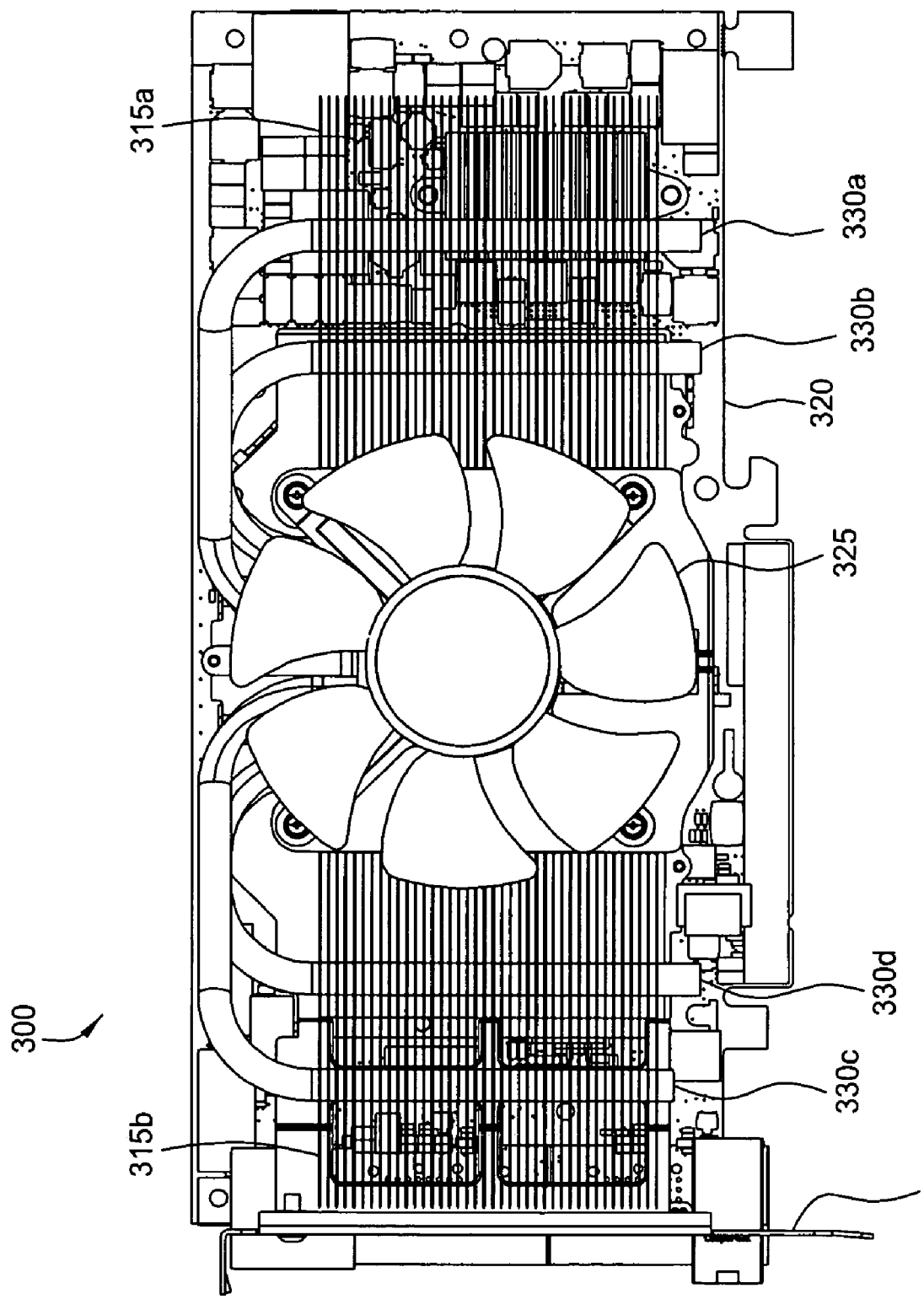
Figure 3E:
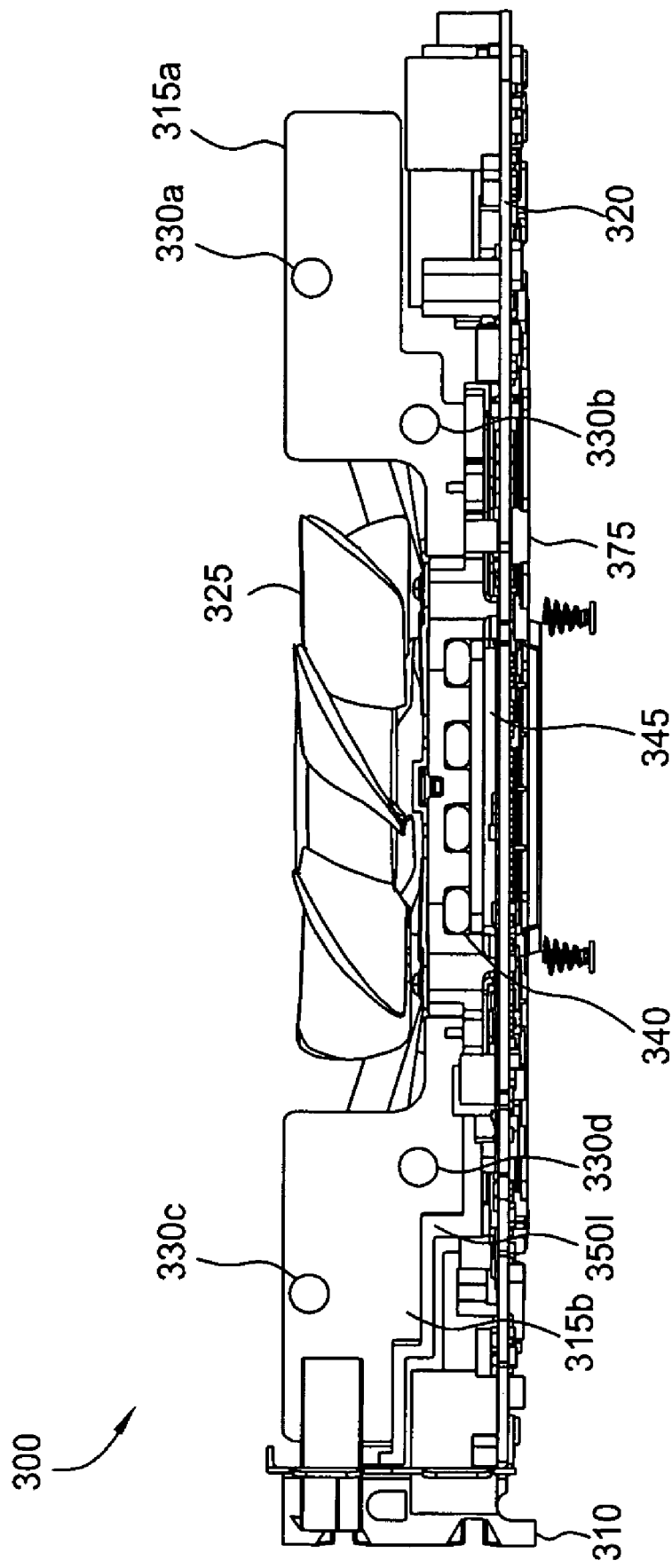
Figure 3F:
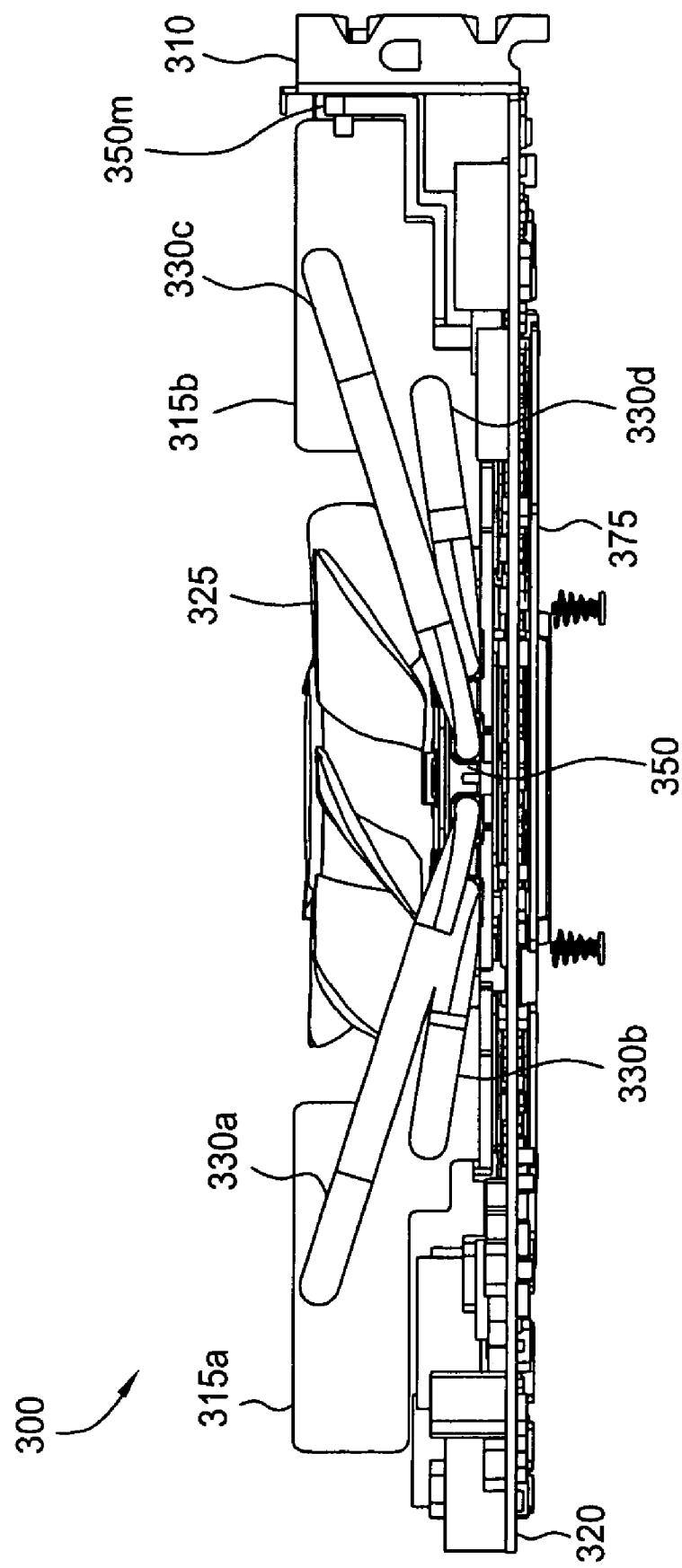
Figure 3H:
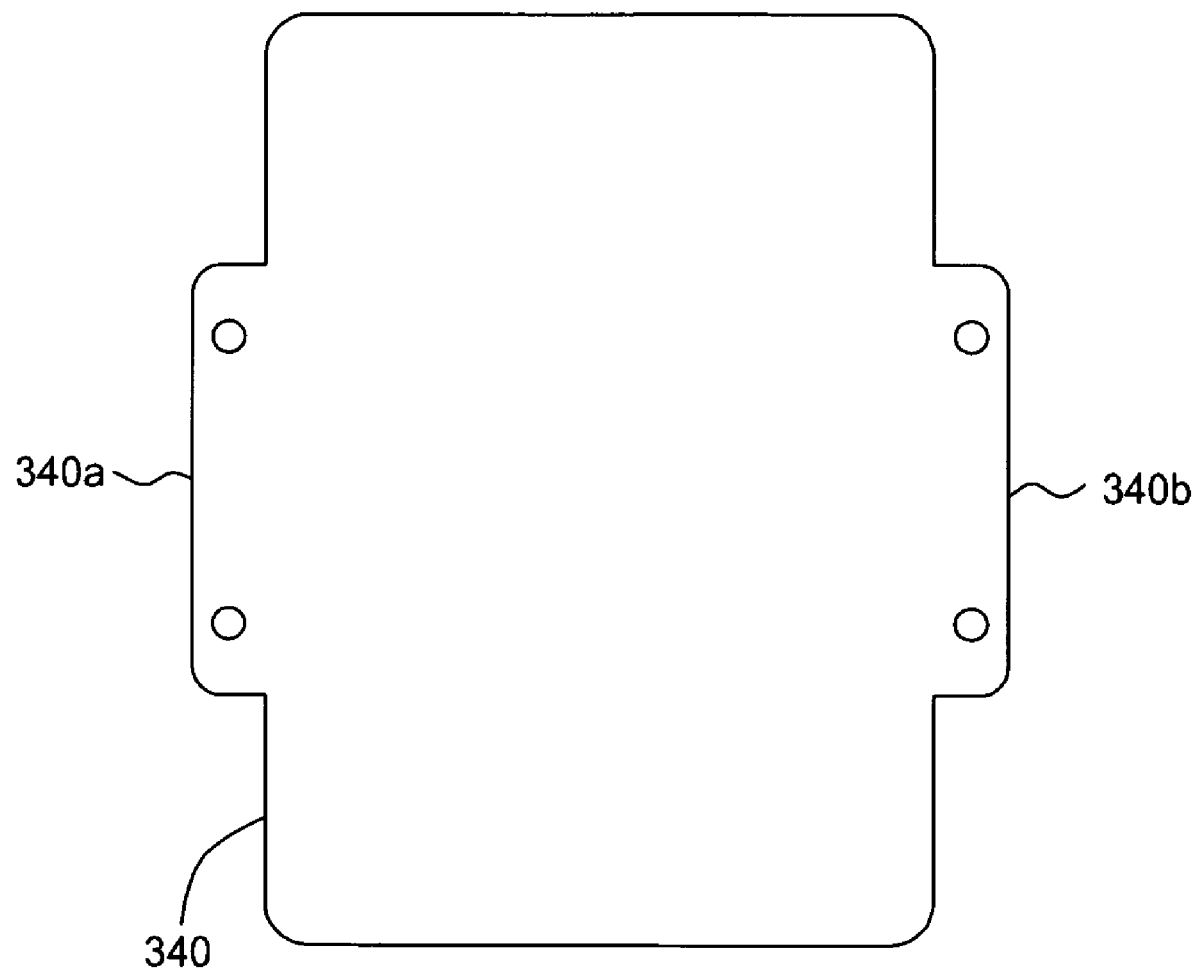
Figure 3I:
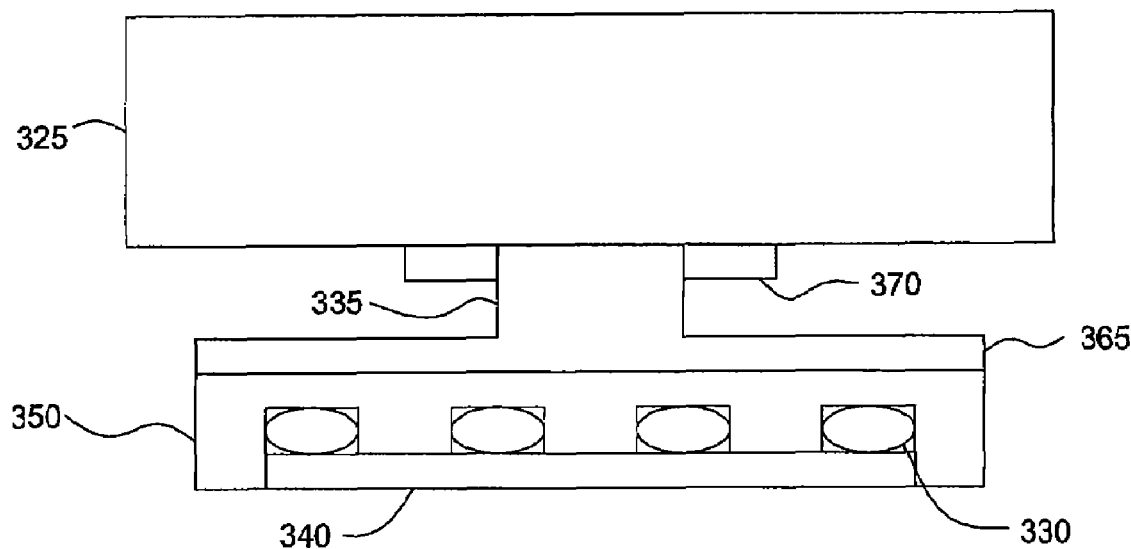
Figure 3J:
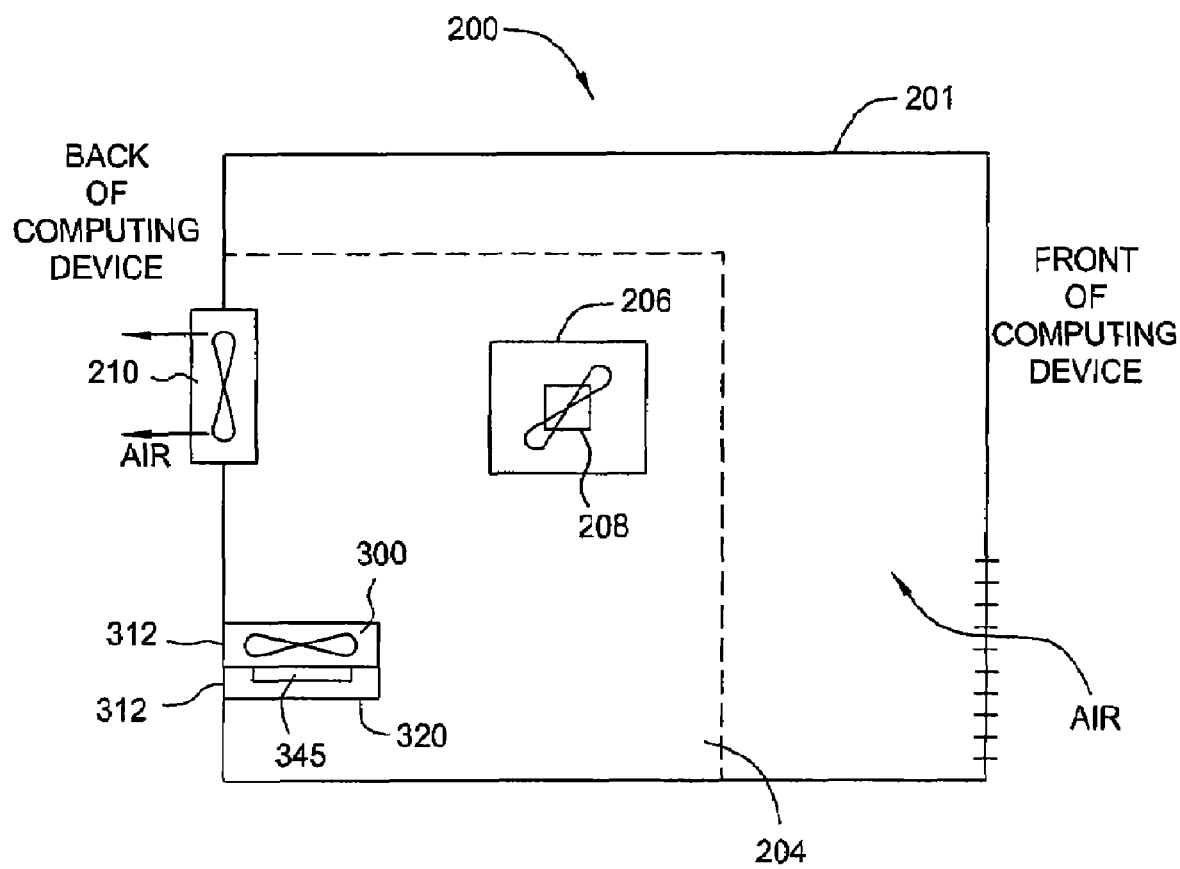

FIGS. 3A-J are various views of a cooling system 300, or components thereof, used to cool a heat-generating electronic device, according to one embodiment of the present invention. A shroud 305 of the cooling system has been omitted from FIGS. 3A and 3D-3F for the sake of illustration. Referring to FIG. 3B, as shown, cooling system 300 is configured to be thermally and structurally coupled to a printed circuit board (PCB), such as the graphics card 320 or graphics card 202 of FIG. 2. Mounted on a top side, the graphics card 320 includes GPU 345 and other components, such as memory units 347a-d. The graphics card 320 may also include memory units (not shown) on a bottom side. Preferably, the graphics card 320 is configured to connect to a personal computer (see computing device 200 of FIG. 2) via a standard peripheral component interconnect (PCI) slot. Further, the cooling system 300 is configured so that when it is mounted to the graphics card 320, the cooling system 300 and the graphics card 320 will fit substantially within two standard PCI slots 312 of a personal computer 200, as shown in FIG. 3J. In alternate embodiments, the cooling system 300 may be configured to be coupled to any type of PCB for use in cooling a heat-generating electronic device mounted on that circuit board, such as an accelerated graphics port (AGP) card.

Referring to FIGS. 3B and 3C, the cooling system 300 includes, without limitation, the shroud 305, a bracket 310, a front set of fins 315a, a rear set of fins 315b, heat pipes 330a-d, system base 350, heat sink plate 340, back plate 375, and a fan including an impeller 325, fan motor (not shown), fan base 335, and insulation pad 365. The shroud 305 and the impeller 325 are made from plastic. The heat sink plate 340 is made from a thermally conductive material, preferably copper. The sets of fins 315a,b, heat pipes 330a-d, system base 350, and back plate 375 are made from a thermally conductive material, preferably aluminum. The fan base 335 is made from a metal, preferably aluminum. The insulation pad 365 is made from a thermally insulative material, such as a high temperature plastic or a ceramic.

Disposed on a top side of the GPU 345 is the heat sink plate 340. A bottom side of the heat sink plate 340 is thermally coupled to the GPU 345 so as to conduct heat from the GPU 345 to the heat sink plate 340. Disposed on a top side of the heat sink plate 340 are the heat pipes 330a-d. The heat pipes 330a-d are thermally coupled to the heat sink plate 340, the system base 350, and the fins 315a,b so as to conduct heat from the heat sink plate 340 and the system base 350 to the fins 315a,b. Also disposed on a top side of the heat sink plate 340 is the system base 350. As described in further detail below, the heat pipes 330a-d are received in a housing portion 350n of the system base 350 and are supported by a platform portion 350o of the system base. The platform portion 350o has a recess formed therein for each heat pipe 330a-d to seat.

Referring to FIGS. 3G and 3H, the heat pipes 330a-d are received in respective channels 350g-j formed in the bottom side of the housing portion 350o of the system base 350. The heat sink plate 340 is received in recess 350k formed in the bottom side of the system base 350. The heat sink plate 340 has two ears 340a,b, each ear having two holes disposed therethrough. The ears 340a,b are received in corresponding recesses 350a,b formed in a bottom side of the system base 350. Disposed in each recess 350a,b are two pegs which fit into the two holes of a respective ear 340a,b, thereby coupling the heat sink plate 345 to the system base 350. Also formed on the bottom side of the system base 350 are four protrusions 350c-f. The protrusions 350c-f are sized and located to correspond with the memory units 347a-d so that the system base 350 will conduct heat away from the memory units, thereby cooling the memory units 347a-d.

Returning to FIGS. 3B and 3C, the graphics card 320 is disposed between the system base 350 and the back plate 375. Each of these three members have a plurality of corresponding holes for fasteners, such as screws, to mount the system base 350 and the back 375 to the graphics card 320. The back plate 375 may also have a plurality of protrusions (not shown) on a top side thereof whose locations correspond to the locations of memory units (not shown) on the bottom side of the graphics card 320.

The system base 350 has an extended portion 350l. The extended portion 350l has a stepped profile for receiving a corresponding stepped profile of fins 315b. The extended portion 350l has a lug 350m which receives a fastener to couple the system base 350 to the bracket 310, which is configured to couple the graphics card 320 to a computer chassis (not shown). Connecting the system base 350 to the bracket in this fashion enables energy from system shock and vibration to transfer from the cooling system 300 to the computer chassis. The lug also grounds the system base 350 to the computer chassis, which protects the electronic components on the graphics card 320. Disposed through the bracket 310 is a plurality of slots 355 which allows air forced through the fins 315b, by the impeller 325, to exit the rear of the computer.

Disposed on the extended portion 350l of the system base 350 is the rear set of fins 315b. Disposed through the fins 315b, substantially perpendicular to each individual fin, are the upper rear heat pipe 330c and the lower rear heat pipe 330d. The heat pipes 330c,d are thermally coupled to the fins 315b so as to conduct heat from the heat sink plate 340 and the system base 350 to each individual fin. The fins 315b may be open at the bottom thereof to allow some airflow to other components of the graphics card 320 located therebelow.

Disposed on a front portion of the graphics card 320 and on a lip of the system base 350 is the front set of fins 315a. The fins 315a have a stepped profile which correspond to the profiles of certain electronic components located on the corresponding part of the graphics card 320. Such a configuration allows the fins 315a to be thermally coupled to these electronic components. Air forced through the fins 315a by the impeller 325 exits into the chassis of the computer. Disposed through the fins 315a, substantially perpendicular to each individual fin, are the upper front heat pipe 330a and the lower front heat pipe 330b. The heat pipes 330a,b are thermally coupled to fins 315a so as to conduct heat from the heat sink plate 340 and the system base 350 to each individual fin. The fins 315b are open at the bottom thereof to allow some airflow to other components of the graphics card 320 located therebelow. In one embodiment, one or more of these other components have their own set of fins 380.

The lower heat pipes 330b,d extend through a lower portion of respective fins 315a,b at locations of the fins proximate to the impeller 325, while the upper heat pipes 330a,c extend through an upper portion of the respective fins 315a,b at locations of the fins distal from the impeller. Having two heat pipes for each set of fins located in this catercorner fashion results in more even heat distribution across the fins. A more even heat distribution increases the effective heat transfer area of the system which results in more efficient cooling.

Disposed between the sets of fins 315a,b is the impeller 325. As described in further detail below, the impeller 325 is configured to impel air downward and outward through the fins 315a,b in order to create a swirling effect. Again, the impeller 325 is made from plastic. The use of a plastic impeller 325 decreases the level of noise produced by cooling system 300. Preferably, the diameter of the impeller 325 is greater than or equal to two-thirds (more preferably three-fourths and most preferably eighty-five percent, excluding the connector portion of the graphics card 320) of the width of the graphics card 320. Having such a large impeller 325 enables a relatively high airflow at lower fan speeds.

Placement of the fan 325 in the middle of the cooling system 300 enables bi-directional cooling flow using two sets of fins 315a,b and four heat pipes. By using two sets of fins, the effective heat transfer area (i.e., the total surface area of the fins across which air is forced) is substantially increased relative to prior-art cooling systems. Further, using two sets of fins increases the effective heat transfer area without substantially increasing the flow resistance across the fins—as would be the case, for example, if longer fins were added to a standard, unidirectional cooling system design.

As described above with reference to prior art blowers/fans, the velocity profile produced by conventional blowers/fans is unequal along the height of a fin, resulting in unequal heat transfer across the surface area of the fin when air is blown over the fin. This phenomena results in inefficient heat transfer between the fin and the air. In one or more embodiments of the present invention, however, the impeller 325 is configured to impel air downward and outward through the fins 315a,b. Generally, the downwardly forced air is deflected upward off the system base 350. The upwardly deflected air is then deflected downward again by the bottom surface of the shroud 305. The repeated upward and downward deflections induce a swirling effect causing flow through the fins 315a,b in a swirling pattern. This swirling effect increases the heat transfer from the fins 315a,b to the air passing over the fins by more evenly distributing airflow across the surface of each individual fin. The increased heat transfer between the fins 315a,b and the are forced across the fins 315a,b by impeller 325 results in a greater cooling capacity relative to prior art designs.

Referring to FIG. 31, the impeller 325 is coupled to the fan base 335, in a manner which allows free rotation relative to the fan base 335. Also coupled to the fan base 335 is a fan PCB 370 containing electronics for the fan motor (not shown). The fan motor is disposed underneath a hub portion of the impeller 325. Disposed between the fan base 335 and the system base 350 is the insulation pad 365. The insulation pad 365 thermally isolates the fan base 335 from the system base 350 so as to protect the plastic impeller 325 from failure due to high temperature. The fan base 335 and the insulation pad 365 have holes which correspond to holes in the system base 350 and receive fasteners, such as screws, thereby coupling the fan base 335 to the system base 350. Substantially enclosing the fins 315a,b is the shroud 305. The shroud 305 has a plurality of holes that correspond to holes in the system base 350 which receive fasteners (not shown) to couple the shroud to the system base.

The plastic impeller 325, the bi-directional airflow (enabled by the heat pipes 330a-d), the swirling effect, and the catercorner placement of the heat pipes 330a-d each contribute to a more efficient and/or quieter cooling system 300 than prior art designs. The efficiency increases result from increasing the effective heat transfer area of each fin by more evenly distributing heat conducted from the heat pipes 330a-d across each fin and from increasing the heat transfer between the fins 315a,b and the air forced across the fins 315a,b by more evenly distributing the airflow across the surface of each fin. Thus, for a given graphics card 320, the fan may be operated at a lower speed to provide the required cooling as compared to prior art blower/fan designs. Embodiments of the present invention may implement one or more of these features.

While the foregoing is directed to embodiments of the present invention, other and further embodiments of the invention may be devised without departing from the basic scope thereof, and the scope thereof is determined by the claims that follow.

The invention claimed is:

1. A system for cooling a heat-generating electronic device, the system mountable to a first side of a circuit board and the system comprising: a first set of fins and a second set of fins; a fan disposed between the first set and second set of fins and operable to force air through the first set and second set of fins; a first heat pipe to conduct heat from the heat-generating electronic device to the first set of fins, wherein the first set of fins is disposed on a rear portion of the circuit board so that a first airflow through the first set of fins exits to an exterior of a computing device containing the heat-generating electronic device and second set of fins is disposed on a front portion of the circuit board so that a second airflow through the second set of fins exits into an interior or the computing device; and a second heat pipe to conduct heat from the heat-generating electronic device to the first set of fins, wherein the heat pipes are disposed through the first set of fins, the first heat pipe is disposed at a first location of the first set of fins, the second heat pipe is disposed at a second location of the first set of fins, and the second location is opposite to the first location, and wherein the second location is catercorner to the first location.

2. The system of claim 1, wherein the first heat pipe is disposed through the first set of fins.

3. The system of claim 1, further comprising:
   a second heat pipe to conduct heat from the heat-generating electronic device to the second set of fins.

4. The system of claim 3, further comprising: a third heat pipe to conduct heat from the heat-generating electronic device to the first set of fins and a fourth heat pipe to conduct heat from the heat-generating electronic device to the second set of fins.

5. The system of claim 4, wherein:
each of the heat pipes are disposed through their respective set of fins,
the first and third heat pipes are disposed at a first location of each of their respective sets of fins,
the second and fourth heat pipes are disposed at a second location of each of their respective sets of fins, and
each second location is opposite to each first location.

6. The system of claim 5, wherein each second location is catercorner to each first location.

7. The system of claim 3, wherein the system is configured so that a centerline of the fan will be aligned with a centerline of the heat-generating electronic device when the system is mounted to the first side of the circuit board.

8. The system of claim 1, further comprising a base to conduct heat from a memory unit disposed on the circuit board to the first heat pipe.

9. The system of claim 8, further wherein the base has a lug for coupling the base to a chassis of a computer.

10. The system of claim 8, further comprising an insulation pad operable to thermally insulate an impeller of the fan from the base.

11. The system of claim 8, wherein the base and the first set of fins each have a stepped profile to accommodate different components on the circuit board.

12. The system of claim 8, wherein the fan is operable to force at least a portion of the air toward the base to induce swirl through the fins.

13. The system of claim 1, wherein the system is configured so that when the system is mounted to the first side of the circuit board, the system and the circuit board will fit substantially within two standard peripheral component interconnect (PCI) slots of a personal computer.

14. The system of claim 1, wherein the first set of fins has a stepped profile to accommodate different components on the circuit board.

15. The system of claim 1, wherein an impeller of the fan is made from plastic.

16. The system of claim 1, wherein a diameter of an impeller of the fan is greater than or equal to two-thirds of a width of the circuit board.

17. The system of claim 1, further comprising a shroud to substantially enclose the system.

18. The system of claim 1, wherein the circuit board is a peripheral component interconnect (PCI) card and the entire system fits onto the card.

* * * * *

UNITED STATES PATENT AND TRADEMARK OFFICE
CERTIFICATE OF CORRECTION

PATENT NO.         : 7,382,616 B2
APPLICATION NO. : 11/251342
DATED              : June 3, 2008
INVENTOR(S)        : Zoran Stefanoski It is certified that error appears in the above-identified patent and that said Letters Patent is hereby corrected as shown below:

In Column 6, Line 46, please replace "and second" with --and the second--.

In Column 6, Line 49, please replace "or" with --of--.

Signed and Sealed this

Twenty-third Day of December, 2008

JON W. DUDAS
*Director of the United States Patent and Trademark Office*